US008031754B2

(12) United States Patent
Iwai et al.

(10) Patent No.: US 8,031,754 B2
(45) Date of Patent: Oct. 4, 2011

(54) SURFACE EMITTING LASER ELEMENT, SURFACE EMITTING LASER ELEMENT ARRAY, METHOD OF FABRICATING A SURFACE EMITTING LASER ELEMENT

(75) Inventors: Norihiro Iwai, Tokyo (JP); Takeo Kageyama, Tokyo (JP); Kinuka Tanabe, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 221 days.

(21) Appl. No.: 12/108,931

(22) Filed: Apr. 24, 2008

(65) Prior Publication Data
US 2009/0268773 A1    Oct. 29, 2009

(51) Int. Cl.
*H01S 5/00* (2006.01)

(52) U.S. Cl. ............ 372/50.124; 372/43.01; 372/50.11; 372/102

(58) Field of Classification Search ............... 372/50.124
See application file for complete search history.

(56) References Cited

U.S. PATENT DOCUMENTS

| | | | |
|---|---|---|---|
| 5,497,389 A | 3/1996 | Kasukawa et al. | |
| 5,557,626 A * | 9/1996 | Grodzinski et al. | 372/45.01 |
| 5,757,833 A | 5/1998 | Arakawa et al. | |
| 5,854,090 A | 12/1998 | Iwai et al. | |
| 5,903,585 A * | 5/1999 | Dawson et al. | 372/45.011 |
| 6,281,523 B1 | 8/2001 | Iwai et al. | |
| 6,430,203 B1 | 8/2002 | Yokouchi et al. | |
| 6,636,543 B2 | 10/2003 | Iwai et al. | |
| 6,643,315 B2 | 11/2003 | Kasukawa et al. | |
| 6,839,369 B2 | 1/2005 | Iwai et al. | |
| 6,858,863 B2 | 2/2005 | Shimizu et al. | |
| 6,900,475 B2 | 5/2005 | Yokouchi et al. | |
| 6,914,925 B2 | 7/2005 | Shinagawa et al. | |
| 7,061,954 B2 | 6/2006 | Iwai et al. | |
| 7,215,693 B2 | 5/2007 | Iwai et al. | |
| 7,368,316 B2 | 5/2008 | Yokouchi et al. | |
| 7,418,020 B2 | 8/2008 | Hiraiwa et al. | |
| 2002/0012373 A1 | 1/2002 | Yokozeki et al. | |
| 2002/0110169 A1 | 8/2002 | Iwai et al. | |
| 2002/0136253 A1 | 9/2002 | Iwai et al. | |

(Continued)

FOREIGN PATENT DOCUMENTS

JP    2004-103754    4/2004

(Continued)

OTHER PUBLICATIONS

U.S. Appl. No. 09/581,179, filed Sep. 12, 2000, Iwai, et al.

(Continued)

*Primary Examiner* — Jessica Stultz
*Assistant Examiner* — Xnning Niu
(74) *Attorney, Agent, or Firm* — Oblon, Spivak, McClelland, Maier & Neustadt, L.L.P.

(57) ABSTRACT

A surface emitting laser element that includes a cylindrical mesa post in which a plurality of semiconductor layers including an active layer is grown and that emits a laser light in a direction perpendicular to a substrate surface, the surface emitting laser element including a dielectric multilayer film on a top surface of the mesa post in at least a portion over a current injection area of the active layer; and a dielectric portion that includes layers fewer than layers of the dielectric multilayer film and that is arranged on a portion excluding the portion over the current injection area on the top surface of the mesa post and on at least part of a side surface of the mesa post.

8 Claims, 6 Drawing Sheets

U.S. PATENT DOCUMENTS

| | | |
|---|---|---|
| 2002/0141467 A1 | 10/2002 | Iwai et al. |
| 2002/0146050 A1 | 10/2002 | Iwai et al. |
| 2002/0146053 A1 | 10/2002 | Iwai et al. |
| 2003/0026308 A1 | 2/2003 | Iwai et al. |
| 2005/0123014 A1 | 6/2005 | Shimizu et al. |
| 2005/0186693 A1 | 8/2005 | Yokouchi et al. |
| 2005/0220160 A1 | 10/2005 | Shinagawa et al. |
| 2007/0030874 A1 | 2/2007 | Ariga et al. |
| 2007/0091965 A1 | 4/2007 | Tanabe et al. |
| 2007/0153856 A1 | 7/2007 | Kageyama et al. |
| 2008/0279229 A1* | 11/2008 | Suzuki et al. ............ 372/19 |

FOREIGN PATENT DOCUMENTS

| | | |
|---|---|---|
| JP | 2006-190752 | 7/2006 |

OTHER PUBLICATIONS

U.S. Appl. No. 09/582,624, filed Aug. 21, 2000, Mukaihara, et al.
U.S. Appl. No. 09/441,099, filed Nov. 16, 1999.
U.S. Appl. No. 09/546,691, filed Apr. 10, 2000, Yokouchi, et al.
U.S. Appl. No. 12/103,142, filed Apr. 15, 2008, Yokouchi, et al.
U.S. Appl. No. 09/898,135, filed Jul. 3, 2001.
U.S. Appl. No. 12/029,019, filed Feb. 11, 2008, Takaki, et al.
U.S. Appl. No. 12/056,790, filed Mar. 27, 2008, Kageyama, et al.
U.S. Appl. No. 12/040,348, filed Feb. 29, 2008, Shimizu, et al.
U.S. Appl. No. 12/057,538, filed Mar. 28, 2008, Kageyama, et al.
Office Action issued May 24, 2011, in Japanese Patent Application No. 2006-288735, filed Oct. 24, 2006 (with English-language translation).

* cited by examiner

SURFACE EMITTING LASER ELEMENT, SURFACE EMITTING LASER ELEMENT ARRAY, METHOD OF FABRICATING A SURFACE EMITTING LASER ELEMENT

BACKGROUND OF THE INVENTION

1. Field of the Invention

The present invention relates to a surface emitting laser element that includes a cylindrical mesa post in which a plurality of semiconductor layers including an active layer is grown and that emits a laser light in a direction perpendicular to a substrate surface, a surface emitting laser element array, and a method of fabricating a surface emitting laser element.

2. Description of the Related Art

A vertical cavity surface emitting laser (VCSEL, hereinafter, "a surface emitting laser element") emits a laser light by resonating a light in a direction perpendicular to a growth surface of a plurality of semiconductor layers including an active layer on a substrate. Because the surface emitting laser element is different from an edge emitting laser element in that a cleaving is unnecessary to provide mirrors to form a resonator, a large number of elements can be easily arrayed on a single substrate one-dimensionally or two-dimensionally. The surface emitting laser element has more advantages over the edge emitting laser element in that, for example, a volume of the active layer is extremely small, and laser oscillation can be achieved with an extremely low threshold current and low power consumption. For this reason, the surface emitting laser element draws attentions as a light source for optical communications including optical interconnections, or other various application devices.

Generally, the surface emitting laser element includes a mesa post obtained by etching the semiconductor layers including the active layer on the substrate into a cylindrical shape, and a laser light is emitted from an aperture formed on the mesa post. Generally, a side surface of the mesa post is covered with a dielectric protection film to improve environmental resistance of the surface emitting laser element.

Furthermore, in the surface emitting laser element, a distributed Bragg reflector (DBR) is generally used as the mirrors forming the resonator. Particularly, a dielectric DBR formed of a dielectric multilayer film is known as one that reduces a light absorption loss with a high output of the laser light. A surface emitting laser element including a resonator using the dielectric DBR on a mesa post has been disclosed (see, for example, Japanese Patent Application Laid-open No. 2004-103754).

Because the mesa post of the surface emitting laser element generally has a small diameter of several tens μm, it is difficult to precisely control formation of the dielectric multilayer film as a thick dielectric DBR exclusively on the mesa post area. Therefore, from a viewpoint of productivity, it is easier to form the dielectric DBR on a wide area including the mesa post. With this method, productivity of the surface emitting laser elements each of which includes a mesa post increases. Furthermore, the dielectric multilayer film provided to the side surface of the mesa post can serve as a protection film.

However, when the dielectric multilayer film is formed on the wide area of the surface emitting laser element including the side surface of the mesa post as explained above, a stress caused due to a difference of thermal expansion between the semiconductor layers and the dielectric multilayer film may cause a strain in the active layer in the mesa post. The strain may cause dislocation in the active layer, which leads to a degradation of longterm reliability of the surface emitting laser element.

SUMMARY OF THE INVENTION

It is an object of the present invention to at least partially solve the problems in the conventional technology.

A surface emitting laser element according to the present invention that includes a cylindrical mesa post in which a plurality of semiconductor layers including an active layer is grown and that emits a laser light in a direction perpendicular to a substrate surface, the surface emitting laser element including: a dielectric multilayer film on a top surface of the mesa post in at least a portion over a current injection area (approximately corresponding to a light emitting area) of the active layer; and a dielectric portion that includes layers fewer than layers of the dielectric multilayer film and that is arranged on a portion excluding the portion over the current injection area on the top surface of the mesa post and on at least part of a side surface of the mesa post.

A surface emitting laser element array according to the present invention includes the surface emitting laser elements according to the present invention that are integrally arranged on a substrate.

A method of fabricating a surface emitting laser element according to the present invention that includes a cylindrical mesa post in which a plurality of semiconductor layers including an active layer is grown and that emits a laser light in a direction perpendicular to the substrate surface, the method including: forming a dielectric multilayer film on an area including the mesa post; and etching the dielectric multilayer film on a side surface of the mesa post.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of a surface emitting laser element, a surface emitting laser element array, and a method of fabricating a surface emitting laser element according to the present invention are explained in detail below with reference to FIGS. 1 to 8. The present invention is not limited to the embodiments, and various embodiments can be carried out within a scope of the present invention.

First Embodiment

Figure 1:
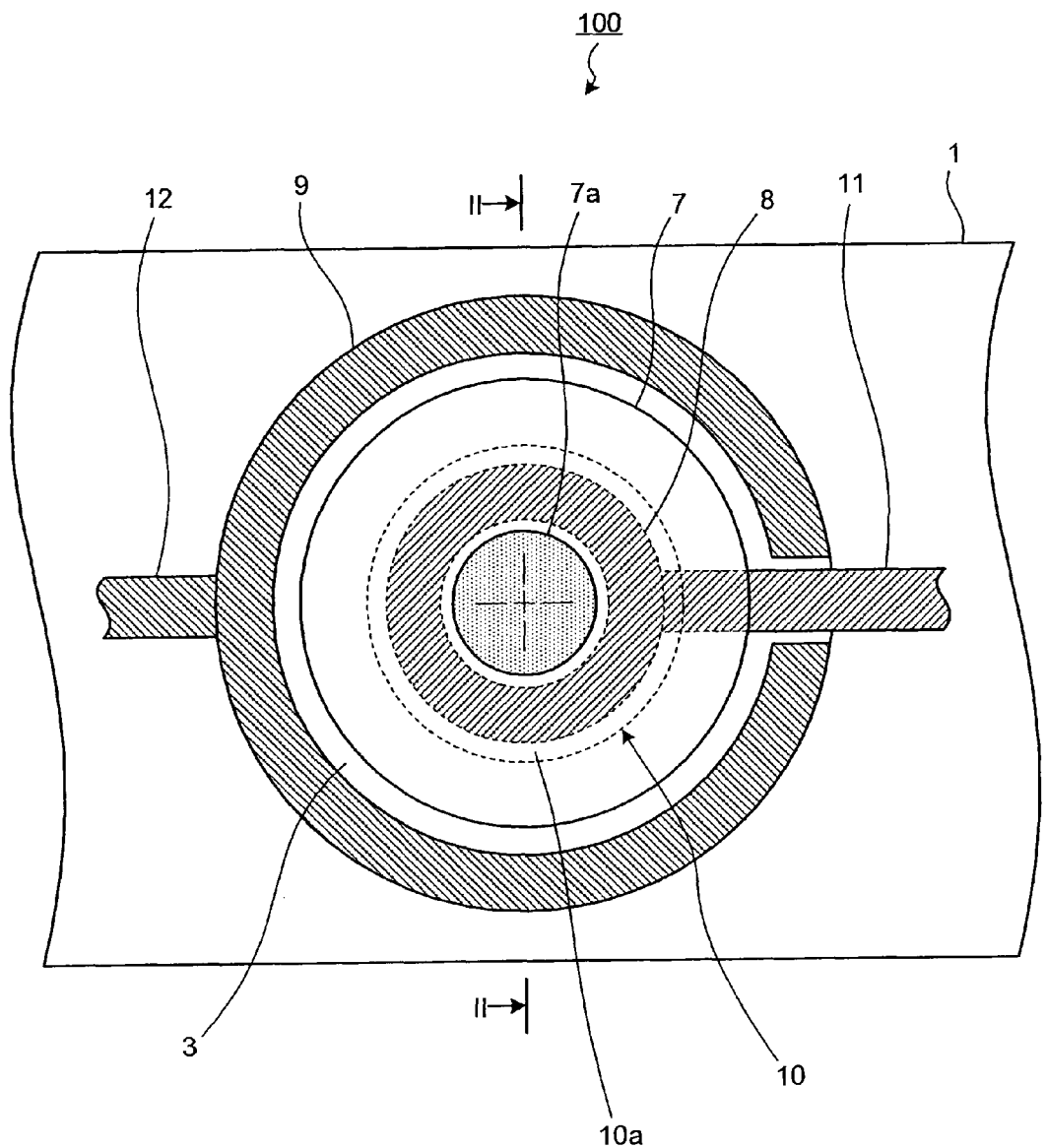
FIG. 1 is a top view of a surface emitting laser element according to a first embodiment of the present invention.
Figure 2:
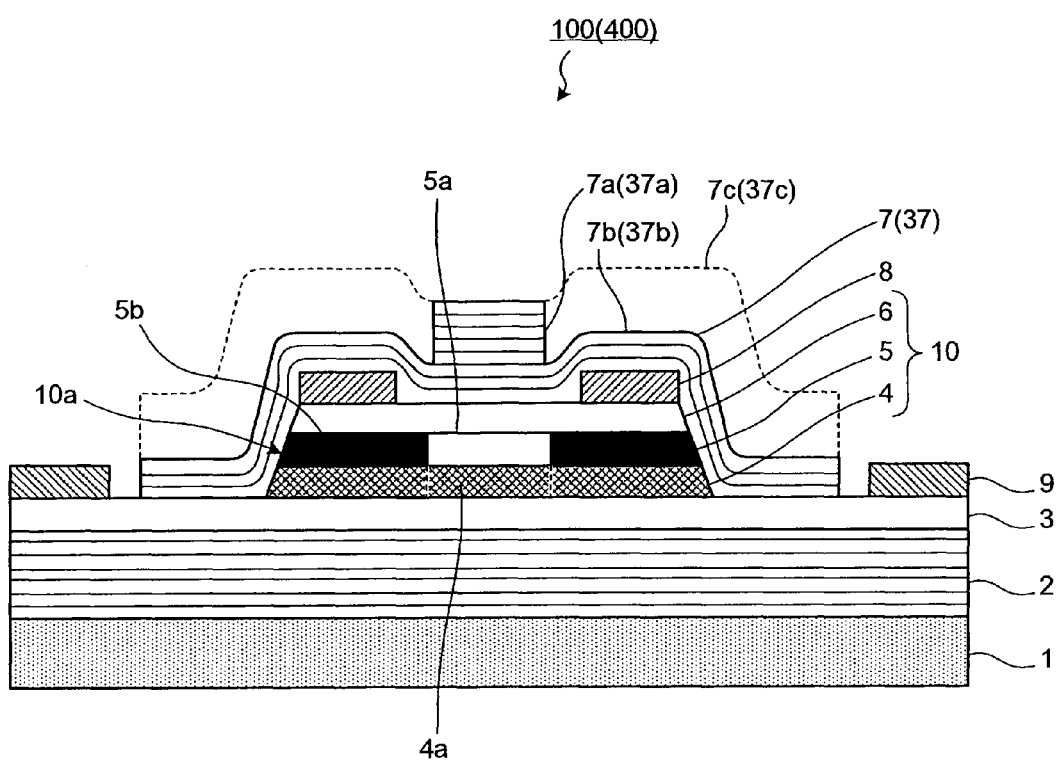
FIG. 2 is a cross sectional view of the surface emitting laser element taken along line II-II shown in FIG. 1.

A surface emitting laser element, a surface emitting laser element array, and a method of fabricating a surface emitting laser element according to a first embodiment of the present invention are explained below. FIGS. 1 and 2 depict a relevant configuration of a surface emitting laser element 100 according to the first embodiment of the present invention. FIG. 1 is a top view of the surface emitting laser element 100, and FIG. 2 is a cross sectional view of the surface emitting laser element 100 taken along line II-II shown in FIG. 1. As shown in FIGS. 1 and 2, the surface emitting laser element 100 includes a lower DBR mirror 2 grown on a semi-insulating substrate 1 that is made of, for example, GaAs, an N contact layer 3, an active layer 4, a current confinement layer 5, a P contact layer 6, an upper DBR mirror 7, a P electrode 8, and an N electrode 9. The active layer 4, the current confinement layer 5, and the P contact layer 6 that are grown on the N contact layer 3 are formed in a cylindrical shape as a mesa post 10 via, for example, an etching process. The active layer 4 is formed on the N contact layer 3 with an N cladding layer (not shown) therebetween, the current confinement layer 5 is formed on the active layer 4 with a first P cladding layer (not shown) therebetween, and the P contact layer 6 is formed on the current confinement layer 5 with a second P cladding layer (not shown) therebetween.

The lower DBR mirror 2 is formed as a semiconductor multilayer film mirror in which a plurality of compound semiconductor layers of, for example, GaAS/AlAs is grown. Each of the compound semiconductor layers has a thickness of $\lambda/4n$ ($\lambda$ is a lasing wavelength, and n is a refractive index of the layer). On the other hand, the upper DBR mirror 7 is formed as a dielectric multilayer film mirror in which a plurality of compound dielectric layers of, for example, SiO/SiN is deposited. The upper DBR mirror 7 has light transmission property of a predetermined light transmittance. The dielectric multilayer film mirror as the upper DBR mirror 7 in the surface emitting laser element 100 reduces an absorption loss of light compared with a case where a semiconductor multilayer film mirror is used instead. Therefore, a low threshold current of 1 mA or less, a high output of 1 mW or more, and a high-temperature operation at 90° C. or more are achieved.

The current confinement layer 5 includes an opening 5a and a selective oxidation layer 5b. The current confinement layer 5 is formed of an Al-containing layer made of, for example, AlAs, and the selective oxidation layer 5b is formed in an annular shape by oxidizing a predetermined area of the Al-containing layer from an outer periphery thereof along a growth surface. The selective oxidation layer 5b is insulative, so that current injected from the P electrode 8 is confined to be concentrated in the opening 5a, thereby increasing current density in the opening 5a.

The active layer 4 has a multiple quantum well (MQW) structure having three strained quantum well layers made of, for example, GaInNAs, in which a spontaneous emission light is generated in a current injection area 4a depending upon the current injected from the P electrode 8 and confined by the current confinement layer 5. The spontaneous emission light is emitted from an emission window 7a of the upper DBR mirror 7 as a laser light after being amplified by resonation in a direction perpendicular to the layers including the active layer 4 between the lower DBR mirror 2 and the upper DBR mirror 7. The emission window 7a is a cylindrical part of the upper DBR mirror 7 and positioned over the current injection area 4a, and it has a circular cross section that is approximately same as that of the current injection area 4a along the growth surface. The emission window 7a is explained in detail later.

The P electrode 8 is formed on the P contact layer 6 that is made of, for example, a p-type-doped p-GaAs to have an uppermost surface with a carrier concentration of $1 \times 10^{19}$ cm$^{-3}$ or more, and is formed in a ring-like shape to partly surround the upper DBR mirror 7 over the current injection area 4a along the growth surface thereof. On the other hand, the N electrode 9 is formed on the N contact layer 3 made of, for example, n-GaAs, and it is formed in a C-like shape to surround a bottom portion of the mesa post 10 along the growth surface thereof. The P electrode 8 and the N electrode 9 are electrically connected to an external circuit (current supply circuit) (not shown) via a P lead electrode 11 and an N lead electrode 12.

The upper DBR mirror 7 formed on the mesa post 10 is explained in detail below. As shown in FIGS. 1 and 2, the upper DBR mirror 7 is integrally formed on an area including the mesa post 10 to cover the mesa post 10. The upper DBR mirror 7 includes the emission window 7a and a lower layer portion 7b having fewer layers than those of the emission window 7a.

The emission window 7a is positioned over the current injection area 4a formed in the active layer 4, and it resonates the spontaneous emission light emitted from the current injection area 4a along with the lower DBR mirror 2 and emits part of the resonated light as a laser light. In other words, the emission window 7a is provided as a part that actually functions as a DBR mirror in the upper DBR mirror 7. On the other hand, the lower layer portion 7b is formed in a surrounding area of the mesa post 10 that includes a side surface 10a of the mesa post 10 and excludes an area over the current injection area 4a, and functions as a protection film that protects the side surface 10a from an external air. It is preferable that the emission window 7a be larger than the current injection area 4a. For example, when a relative position of the emission window 7a with the current injection area 4a is determined by photolithography, it is preferable that a tolerance in diameter between the emission window 7a and the current injection area 4a be 2 µm or more.

The upper DBR mirror 7 is formed by, for example, depositing a dielectric multilayer film having a predetermined number of layers on an area including the mesa post 10 (film deposition process) and by etching the dielectric multilayer film in an area excluding an area over the current injection area 4a (etching process). Specifically, the upper DBR mirror 7 is formed by removing, in the etching process, an etching portion 7c of the dielectric multilayer film formed in the film deposition process. The etching portion 7c is annular and is shown by a dotted line in FIG. 2. In the film deposition process, for example, a plasma chemical vapor deposition (CVD) machine, an electron beam evaporator, or a sputter is used. In the etching process, a dry etching method using, for example, a reactive ion etching (RIE) machine, or a wet etching method using, for example, a hydrofluoric acid solution is used.

In the film deposition process, 12 pairs of dielectric layers of, for example, SiO/SiN are deposited as the dielectric multilayer film. In the etching process, 6 pairs of dielectric layers out of the 12 pairs are etched as the etching portion 7c. As a result, the emission window 7a has the 12 pairs of dielectric layers and the lower layer portion 7b has the 6 pairs of dielectric layers. The number of layers of the emission window 7a and that of the lower layer portion 7b are not limited to this example, and various layer structures are adoptable. For example, the number can be adjusted in a way that more layers are used to reduce a threshold current, or fewer layers are used to increase a light output.

In the upper DBR mirror 7 formed as explained above, the lower layer portion 7b having fewer layers than those of the emission window 7a is formed in the surrounding area including the side surface 10a of the mesa post 10. Therefore, although the upper DBR mirror 7 covers the mesa post 10 including the active layer 4, a stress to be applied to the current injection area 4a of the active layer 4 (the stress is generated due to a difference of coefficient of thermal expansion between the semiconductor layers and the dielectric film) can be reduced, so that a strain in the current injection area 4a can be reduced. This reduces dislocation in the current injection area 4a of the surface emitting laser element 100, which improves the longterm reliability.

Figure 3:
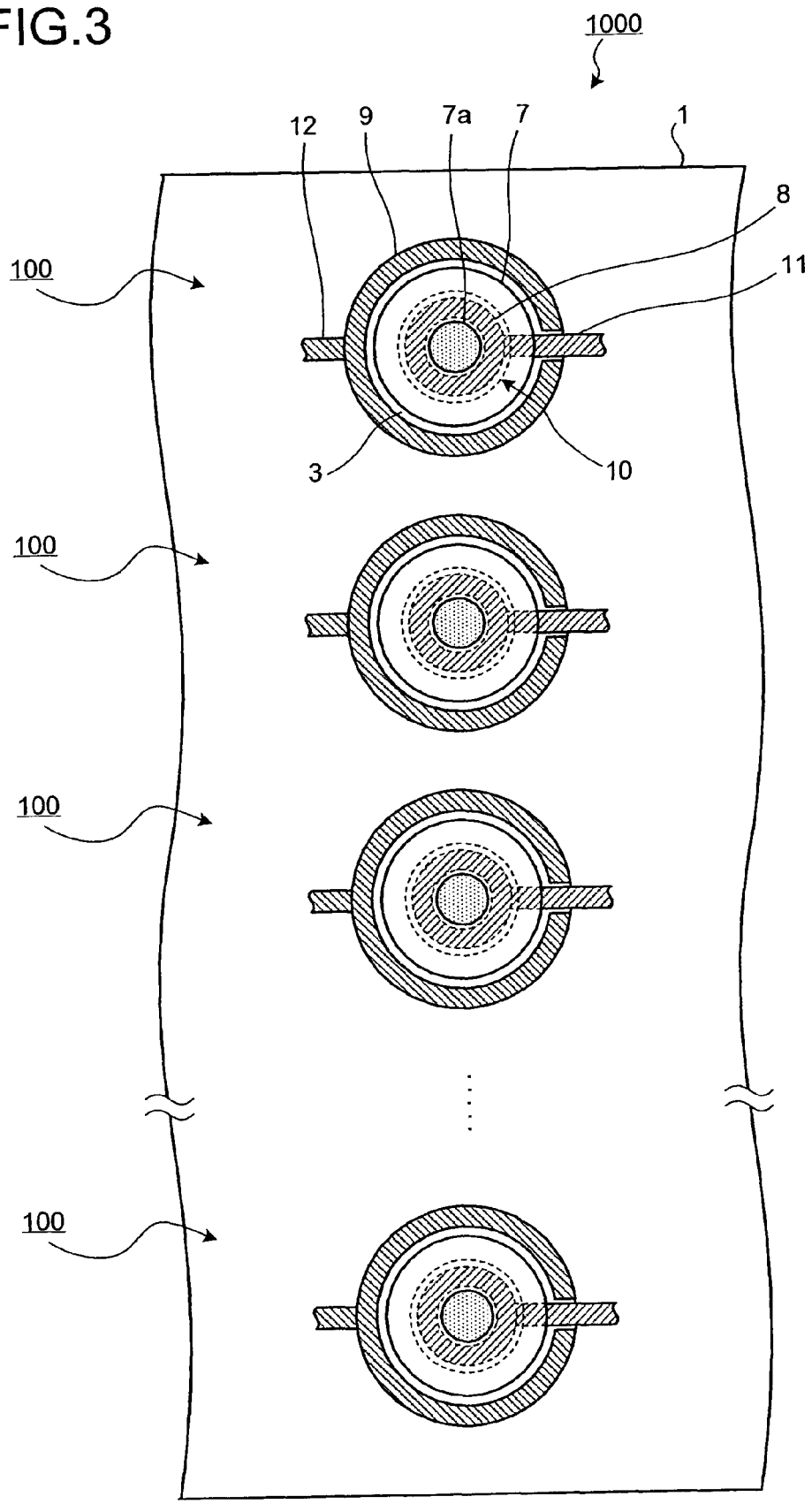
FIG. 3 is a top view of a surface emitting laser element array according to the first embodiment of the present invention.

FIG. 3 depicts a surface emitting laser element array 1000 according to the first embodiment. In the surface emitting laser element array 1000, a plurality of surface emitting laser elements 100 is arrayed integrally on a substrate 1. The P lead electrodes 11 and the N lead electrodes 12 of the surface emitting laser elements 100 are electrically connected individually or commonly to an external current supply circuit, and light emission control is performed individually or commonly depending upon current injected from the current supply circuit.

In such a surface emitting laser element array, even a failure of a single surface emitting laser element of the surface emitting laser element array, for example, causes a malfunctioning of the surface emitting laser element array as a transceiver module. This means that the longterm reliability of the surface emitting laser element array largely depends on the longterm reliability of the single surface emitting laser element. The surface emitting laser element array 1000 includes the surface emitting laser elements 100 with improved longterm reliability by reducing the dislocation in the current injection area 4a. Accordingly, the longterm reliability of the surface emitting laser element array 1000 improves. This effect is particularly noticeable with an increase in the number of the surface emitting laser elements 100 of the surface emitting laser element array 1000.

Second Embodiment

Figure 4:
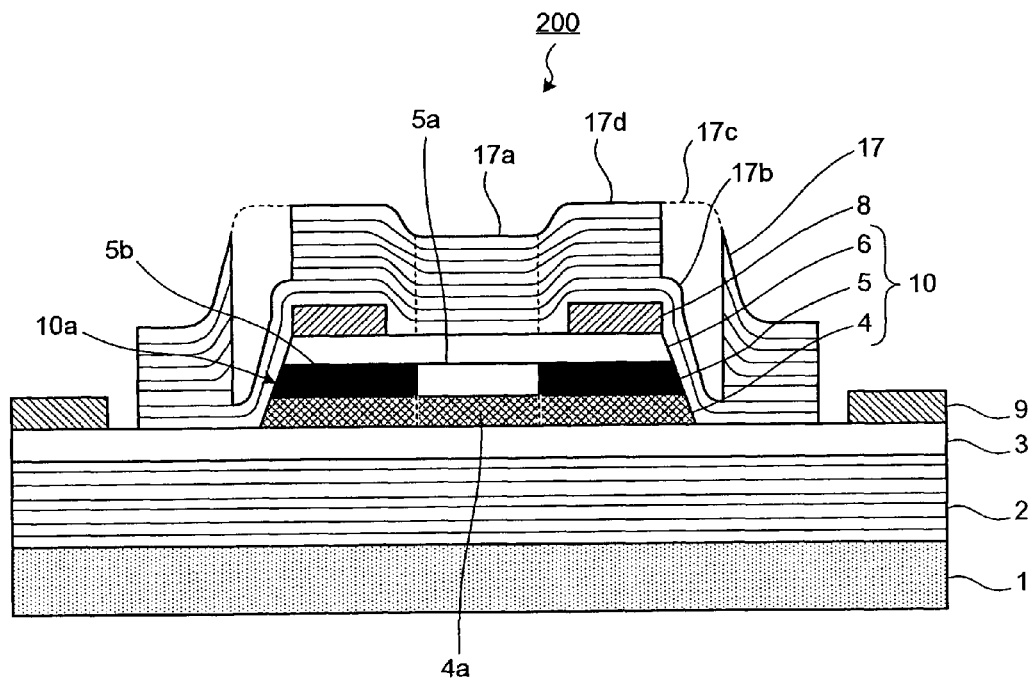
FIG. 4 is a cross sectional view of a surface emitting laser element according to a second embodiment of the present invention.

A surface emitting laser element, a surface emitting laser element array, and a method of fabricating a surface emitting laser element according to a second embodiment of the present invention are explained below. FIG. 4 is a cross sectional view of a surface emitting laser element 200 according to the second embodiment, which depicts a structure in cross section thereof corresponding to that of the surface emitting laser element 100 taken along the line II-II shown in FIG. 1. As shown in FIG. 4, the surface emitting laser element 200 has basically the same configuration as that of the surface emitting laser element 100 except for including an upper DBR mirror 17 instead of the upper DBR mirror 7. Therefore, components same as those of the surface emitting laser element 100 are denoted by the same reference numerals.

As the upper DBR mirror 7, the upper DBR mirror 17 is integrally formed on the area including the mesa post 10 to cover the mesa post 10. The upper DBR mirror 17 includes an upper layer portion 17d including an emission window 17a and a lower layer portion 17b having fewer layers than those of the emission window 17a. As the emission window 7a, the emission window 17a is positioned over the current injection area 4a provided in the active layer 4, and functions as a DBR mirror for a laser light. On the other hand, the lower layer portion 17b is formed on the entire area of the side surface 10a of the mesa post 10, and functions as a protection film that protects the side surface 10a from the external air. The upper layer portion 17d corresponds to a portion of the upper DBR mirror 17 excluding the lower layer portion 17b.

The upper DBR mirror 17 is formed by, for example, depositing a dielectric multilayer film having a predetermined number of layers on an area including the mesa post 10 (film deposition process) and by etching a portion of the dielectric multilayer film, which is formed on the side surface 10a of the mesa post 10 (etching process). Specifically, the upper DBR mirror 17 is formed by removing, in the etching process, an etching portion 17c of the dielectric multilayer film formed in the film deposition process. The etching portion 17c has an annular shape and shown by a dotted line in FIG. 4.

As the upper DBR mirror 7, the upper DBR mirror 17 in which the lower layer portion 17b is formed only on the side surface 10a of the mesa post 10 can reduce a stress to be applied to the current injection area 4a of the active layer 4, which reduces the strain in the current injection area 4a. This reduces dislocation in the current injection area 4a, which improves the longterm reliability of the surface emitting laser element 200.

As the surface emitting laser element array 1000, a surface emitting laser element array according to the second embodiment is formed by arraying the surface emitting laser elements 200 integrally on the substrate 1. The surface emitting laser element array includes the surface emitting laser elements 200 with improved long reliability. Accordingly, the longterm reliability of the surface emitting laser element array improves.

Third Embodiment

Figure 5:
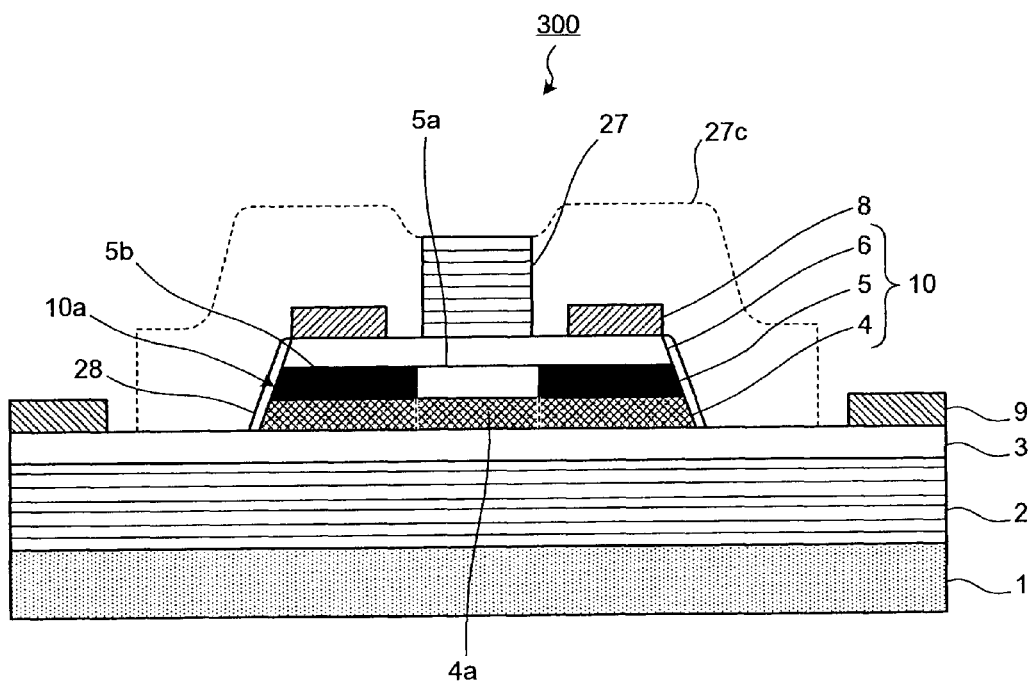
FIG. 5 is a cross sectional view of a surface emitting laser element according to a third embodiment of the present invention.

A surface emitting laser element, a surface emitting laser element array, and a method of fabricating a surface emitting laser element according to a third embodiment of the present invention are explained below. FIG. 5 is a cross sectional view of a surface emitting laser element 300 according to the third embodiment, which depicts a structure in cross section thereof corresponding to that of the surface emitting laser element 100 taken along the line II-II shown in FIG. 1. As shown in FIG. 5, the surface emitting laser element 300 basically has the same configuration as that of the surface emitting laser element 100 except for including an upper DBR mirror 27 instead of the upper DBR mirror 7 and further including a protection film 28. Therefore, components same as those of the surface emitting laser element 100 are denoted by the same reference numerals.

The upper DBR mirror 27 is formed in an area over the current injection area 4a provided in the active layer 4 or in an area slightly larger than the area over the current injection area 4a, and functions as a DBR mirror for a laser light as a whole. On the other hand, the protection film 28 is formed of one, two or more layers of a dielectric film made of SiO, SiN, or the like, and it is provided to an exposed surface of the semiconductor layers, which includes the entire area of the side surface 10a of the mesa post 10, to protect the side surface 10a from the external air.

The upper DBR mirror 27 is formed by, for example, depositing a dielectric multilayer film having a predetermined number of layers on an area including the mesa post 10 (film deposition process) and by etching the whole dielectric multilayer film in an area excluding an area over the current injection area 4a (etching process). Specifically, as shown in FIG. 5, the upper DBR mirror 27 is formed by removing, in the etching process, an annular etching portion 27c of the dielectric multilayer film formed in the film deposition process. After the upper DBR mirror 27 is formed in the above manner, the protection film 28 is formed by depositing a dielectric film on an area including the side surface 10a and by etching the dielectric film excluding a portion on the side surface 10a.

Figure 6:
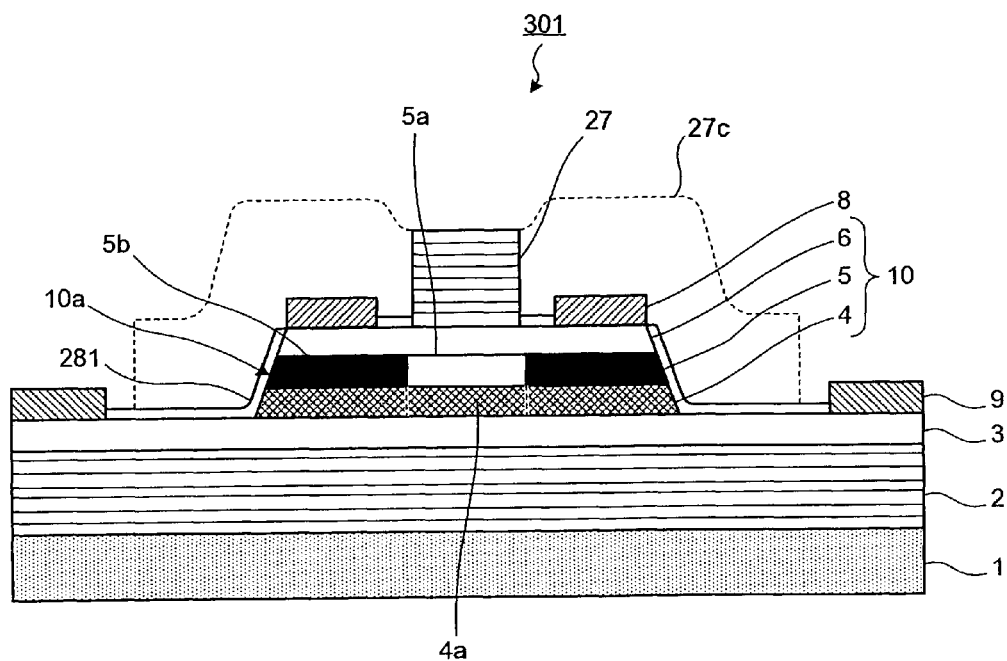
FIG. 6 is a cross sectional view of a surface emitting laser element according to a modified example of the third embodiment of the present invention.

In the third embodiment, the protection film 28 is formed only on the side surface 10a. However, as shown in FIG. 6 depicting a surface emitting laser element 301 as a modified example of the third embodiment of the present invention, it is preferable that a protection film 281 be provided to every semiconductor-layer-exposed portion (for example, on the N contact layer 3 in an area on which the mesa post 10 and the N electrode 9 are not formed, and on the P contact layer 6 in an area on which the P electrode 8 and the upper DBR mirror 27 are not formed).

The protection films 28 and 281 can be formed by leaving one or two layers of the dielectric multilayer film in a portion corresponding to the protection films 28 and 281 in the etching process for forming the upper DBR mirror 27.

Because the upper DBR mirror 27 is formed only in the area over the current injection area 4a as explained above, a stress to be applied to the current injection area 4a of the active layer 4 is reduced, which reduces the strain in the current injection area 4a in the same manner as the above upper DBR mirror 7. This reduces the dislocation in the current injection area 4a of the surface emitting laser elements 300 and 301, which improves the longterm reliability thereof. Because the protection films 28 and 281 are thin and therefore apply small stress to the current injection area 4a compared with the upper DBR mirror 27, the protection films 28 and 281 do not increase the strain in the current injection area 4a.

Figure 7:
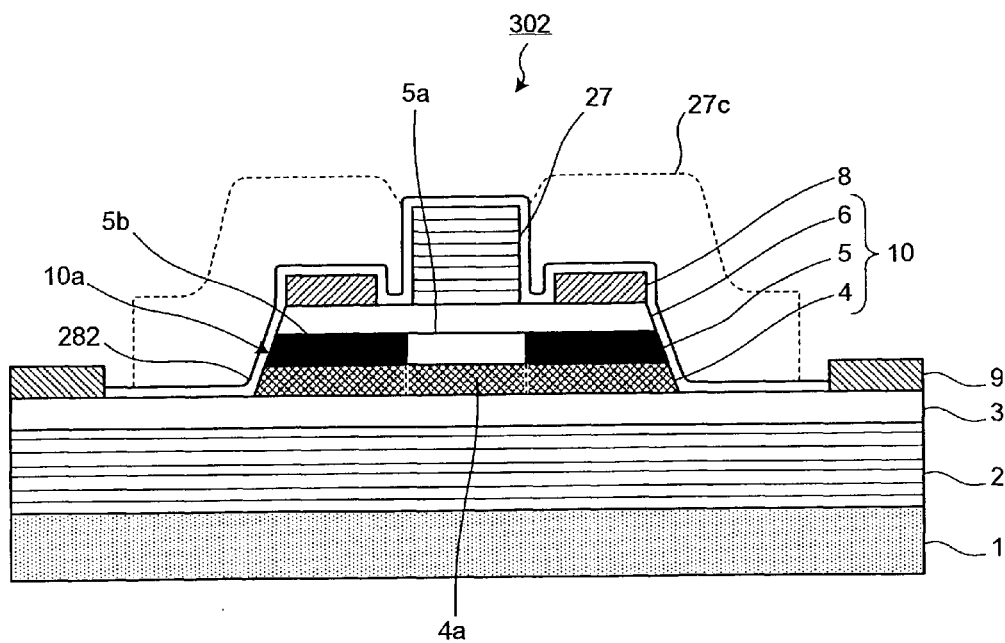
FIG. 7 is a cross sectional view of a surface emitting laser element according to another modified example of the third embodiment of the present invention.

FIG. 7 is a cross sectional view of a surface emitting laser element 302 according to another modified example of the third embodiment of the present invention. The surface emitting laser element 302 basically has the same configuration as that of the surface emitting laser element 300 except that a protection film 282 is formed to cover not only the side surface 10a but also the upper DBR mirror 27. The protection film 282 is one, two or more layers of a dielectric film made of, for example, SiO, SiN, or a pair of SiO/SiN, and forms a dielectric multilayer mirror together with the upper DBR mirror 27. Therefore, the protection film 282 functions not only as a protection film but also as a top layer of an upper resonator mirror.

As the surface emitting laser element array 1000, a surface emitting laser element array according to the third embodiment is obtained by arraying the surface emitting laser elements 300, 301 or 302 integrally on the substrate 1. The surface emitting laser element array includes the surface emitting laser elements 300, 301 or 302 with improved longterm reliability. Accordingly, the longterm reliability of the surface emitting laser element array improves as well.

Fourth Embodiment

Figure 8:
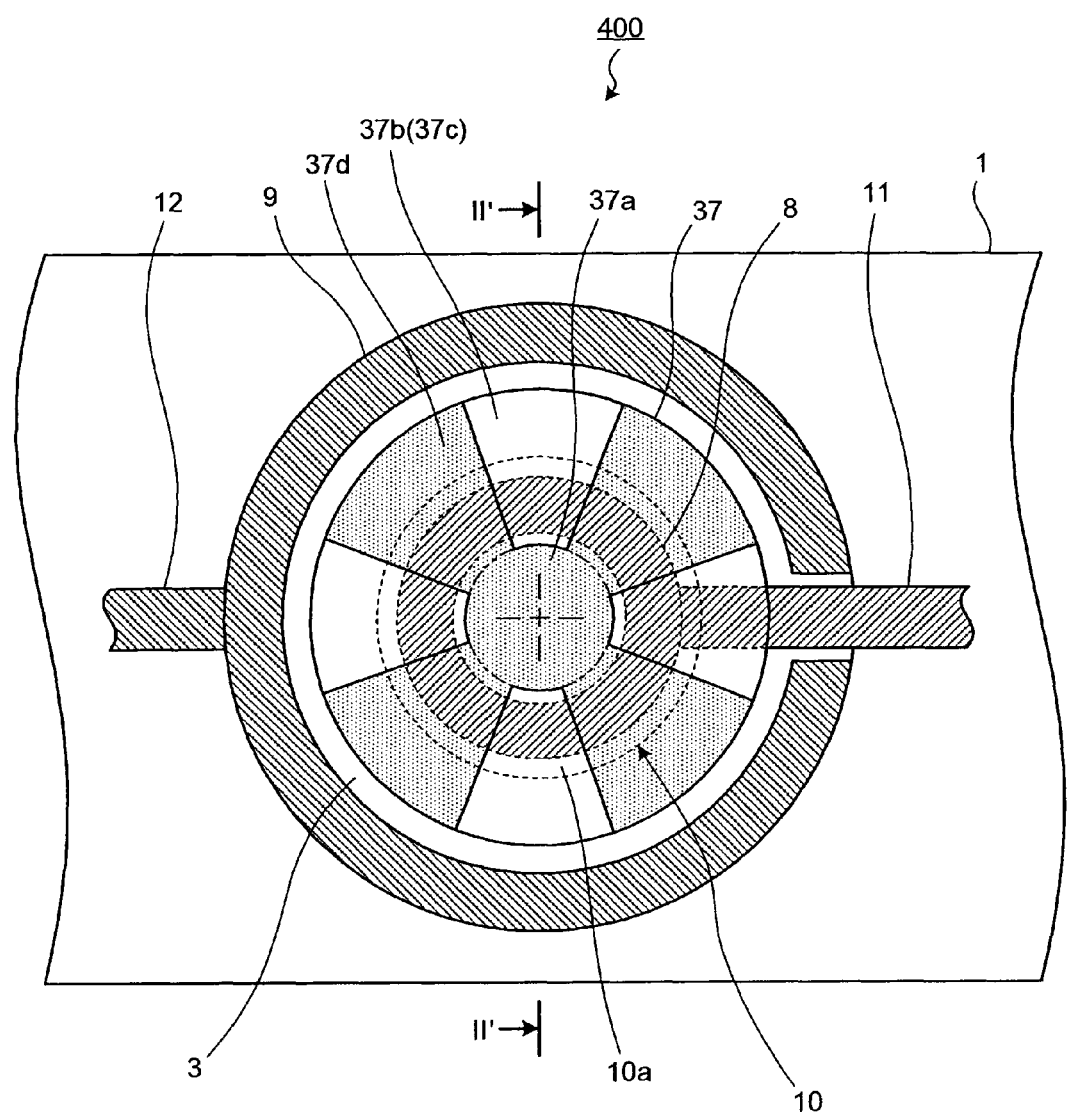
FIG. 8 is a top view of a light emitting laser element according to a fourth embodiment of the present invention.

A surface emitting laser element, a surface emitting laser element array, and a method of fabricating a surface emitting laser element according to a fourth embodiment of the present invention are explained below. FIG. 8 is a top view of a surface emitting laser element 400 according to the fourth embodiment. The cross section of the surface emitting laser element 400 taken along a line II'-II' in FIG. 8 is depicted in FIG. 2. As shown in FIGS. 2 and 8, the surface emitting laser element 400 basically has the same configuration as that of the surface emitting laser element 100 except for including an upper DBR mirror 37 instead of the upper DBR mirror 7. Therefore, components same as those of the surface emitting laser element 100 are denoted by the same reference numerals.

In the surface emitting laser element 100, the cross-sectional structure of the upper DBR mirror 7 shown in FIG. 2 is formed entirely along the side surface 10a of the mesa post 10, so that the emission window 7a is cylindrical and the lower layer portion 7b is annular. On the other hand, in the surface emitting laser element 400, the cross-sectional structure of the upper DBR mirror 37 shown in FIG. 2 is formed at a plurality of positions partially in a circumferential direction of the side surface 10a.

Specifically, for example, as shown in FIG. 8, a lower layer portion 37b is formed at four positions at intervals of 90° in the circumferential direction of the side surface 10a (four rightward, leftward, upward, and downward positions shown in FIG. 8). Each portion sandwiched by the lower layer portions 37b is formed as an upper layer portion 37d having layers equal in number to that of an emission window 37a. As the emission window 7a, the emission window 37a is positioned over the current injection area 4a and functions as a DBR mirror for a laser light. The lower layer portion 37b has fewer layers than those of the emission window 37a and functions as a protection film for protecting the side surface 10a from the external air.

The lower layer portion 37b and the upper layer portion 37d can be provided at any one or more positions at any intervals in the circumferential direction of the side surface 10a instead of at the four positions at intervals of 90° in the circumferential direction. Furthermore, widths (central angles) of the lower layer portion 37b and the upper layer portion 37d in the circumferential direction can be appropriately changed depending on the number of the lower layer portion 37b and the upper layer portion 37d to be formed and intervals therebetween. Moreover, it is sufficient that the lower layer portion 37b is formed at least on the side surface 10a in a radial direction of the mesa post 10. In other words, it is sufficient that the lower layer portion 37b is formed on the side surface 10a in at least a part in the circumferential direction.

The upper DBR minor 37 is formed by, for example, depositing a dielectric multilayer film having a predetermined number of layers on an area including the mesa post 10 (film deposition process) and by etching the dielectric multilayer film deposited on the side surface 10a in at least a part in the circumferential direction (etching process). Specifically, as shown in FIG. 2, the upper DBR mirror 37 is formed by removing, in the etching process, an etching portion 37c (for example, the etching portion 37c in the four positions shown in FIG. 8) of the dielectric multilayer film, which is formed in the film deposition process, in a predetermined area of the mesa post 10 in the circumferential direction of the side surface 10a.

The upper DBR mirror 37, in which the lower layer portion 37b is formed on the side surface 10a of the mesa post 10 in at least a part in the circumferential direction, can reduce the stress to be applied to the current injection area 4a of the active layer 4 and reduce the strain in the current injection area 4a. This reduces dislocation in the current injection area 4a of the surface emitting laser element 400 and the longterm reliability thereof improves.

As the surface emitting laser element array 1000, the surface emitting laser element array according to the fourth embodiment is obtained by arraying the surface emitting laser elements 400 integrally on the substrate 1. The surface emitting laser element array includes the surface emitting laser elements 400 with improved longterm reliability. Accordingly, the longterm reliability of the surface emitting laser element array improves.

Although preferred embodiments of the present invention are explained above as the first to fourth embodiments, the present invention is not limited to the first to fourth embodiments.

For example, in the first, second, and fourth embodiments, each of the lower layer portions 7b, 17b, and 37b is formed by etching, in the etching process, the dielectric multilayer film formed in the film deposition process, i.e., each of the upper DBR mirrors 7, 17, and 37 is formed by performing the film deposition process once. However, the number of times for performing the film deposition process is not limited to one. The film deposition process can be performed twice or more to form the upper DBR mirrors 7, 17, and 37. Specifically, for example, the upper DBR mirrors 7, 17, and 37 each of which includes the emission window and the lower layer portion can be formed in a way that, after the first film deposition process and after the portion corresponding to the lower layer portion 7b, 17b, or 37b is removed from the multilayer film in the etching process, a dielectric film is formed as the lower layer portion 7b, 17b, or 37b. With this method, for example, each of the emission windows 7a, 17a, and 37a can be formed of a dielectric film made of a film material different from that of the lower layer portions 7b, 17b, and 37b, and optimum film materials can be adopted as DBR mirrors and protection films. Each of the lower layer portions 7b, 17b, and 37b serving as protection films is not required to be a multilayer film and can be a single-layer film. Furthermore, instead of the film deposition process and the etching process, a photolithography method and a lift-off method can be adopted to form a dielectric film in a predetermined portion.

In the second and fourth embodiments, each portion of the upper DBR mirrors 17 and 37 excluding the lower layer portions 17b and 37b is formed to have layers equal in number to that of the emission windows 17a and 37a. However, each of the emission windows 17a and 37a can have layers different in number from that of the upper layer portions 17d and 37d. Similarly, in the first and fourth embodiments, each of the lower layer portions 7b and 37b is formed such that the entire portion thereof has an equal number of layers. However, a portion of each of the lower layer portions 7b and 37b on the side surface 10a can have layers different in number from that of other portions. In this case, it is preferable that the portion on the side surface 10a have fewer layers than those of the other portions.

In the first to fourth embodiments, explanation is provided that each of the dielectric films forming the upper DBR mirror 7, 17, 27, and 37 is formed of the compound dielectric layers of, for example, SiO/SiN. However, the film material is not limited to SiO/SiN and any one or any combination of SiO, SiN, a-Si, AlO, MgF, ITO and TiO can be appropriately adopted. Generally, SiO, SiN, and a-Si can be deposited by a plasma CVD, SiO, a-Si, AlO, MgF, ITO, and TiO can be deposited by an electron beam evaporator, and SiO, a-Si, AlO, and ITO can be deposited by a sputter. On the other hand, explanation is provided above that the lower DBR mirror 2 is formed of, for example, the compound semiconductor layers of GaAs/AlAs. However, the lower DBR mirror 2 can be formed of compound semiconductor layers of $Al_xGa_{x-1}As/Al_yGa_{y-1}As$ ($0 \leq x \leq 1$, $0 \leq y \leq 1$).

In the first to fourth embodiments, the surface emitting laser elements 100, 200, 300 to 302, and 400 have an intracavity configuration in which a current is not conducted to the upper DBR mirrors 7, 17, 27, and 37 and the lower DBR mirrors 2. However, alternatively, an n-type GaAs substrate can be used as the substrate 1, an N electrode can be formed on the bottom of the substrate 1, and the lower DBR mirror can be doped with n-type impurities such as Si such that the current is conducted to the lower DBR mirror. Furthermore, in the surface emitting laser elements 100, 200, 300 to 302, and 400, the P electrode 8 is formed above the active layer 4 and the N electrode 9 is formed in a lower position. However, the polarities of the upper electrode and the lower electrode can be switched with each other. Moreover, although explanation is provided above that each of the surface emitting laser elements 100, 200, 300 to 302, and 400 emits a laser light from an area above the active layer 4, they can be configured to emit a laser light from an area below the active layer 4.

In the first to fourth embodiments, the surface emitting laser element array includes the surface emitting laser elements 100, 200, 300 to 302, or 400 that are arrayed in a single direction. However, the array is not limited to the one-dimensional array. Alternatively, the surface emitting laser elements 100, 200, 300 to 302, or 400 can be arrayed two-dimensionally.

The semiconductor layers of each of the surface emitting laser elements 100, 200, 300 to 302, and 400, which are grown on the substrate 1 by, for example, metal organic chemical vapor deposition (MOCVD) or molecular beam epitaxy (MBE). However, other various film forming methods can be appropriately adopted.

In the first to fourth embodiments, the surface emitting laser element that has a lasing wavelength band of 1.3 μm and that includes the active layer 4 made of a GaInNAs material is explained as an example. However, the oscillation wavelength band of the surface emitting laser element and the material of the active layer and the like can be appropriately selected. For example, an AlGaInP material or an InGaAsP material can be selected for a surface emitting laser element having a lasing wavelength band of 650 nm, an InGaAs material can be selected for a surface emitting laser element having a lasing wavelength band of 1 μm, and a GaInAsP material, an AlGaInAs material, or a GaInNAsSb material can be selected for a surface emitting laser element having a lasing wavelength band of 1.3 μm to 1.6 μm.

As explained above, the surface emitting laser element, the surface emitting laser element array, and the method of fabricating a surface emitting laser element according to the present invention are preferably applied to fields of optical interconnections and optical communications.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A surface emitting laser element that includes a cylindrical mesa post in which a plurality of semiconductor layers including an active layer is grown and that emits a laser light in a direction perpendicular to a substrate surface, the surface emitting laser element comprising:

a dielectric multilayer film on a top surface of the mesa post in at least a portion over a current injection area of the active layer; and a dielectric portion that includes layers fewer than layers of the dielectric multilayer film and that is arranged on a portion excluding the portion over the current injection area on the top surface of the mesa post and on a whole side surface of the mesa post, the dielectric portion being an extension of a part of the layers of the dielectric multilayer film.

2. The surface emitting laser element according to claim 1, wherein the dielectric portion is arranged on the whole side surface of the mesa post in a radial direction of the mesa post.

3. The surface emitting laser element according to claim 1, wherein the dielectric portion is arranged as a part of the dielectric multilayer film.

4. The surface emitting laser element according to claim 1, wherein the dielectric multilayer film is made of at least any one of SiO, SiN, a-Si, AlO, MgF, ITO, and TiO.

5. A surface emitting laser element array comprising:
a plurality of surface emitting laser elements that are integrally arranged on a substrate,
each of the surface emitting laser elements including
a cylindrical mesa post in which a plurality of semiconductor layers including an active layer is grown and emits a laser light in a direction normal to the active layer, and further includes
a dielectric multilayer film on a top surface of the mesa post in at least a portion over a current injection area of the active layer; and
a dielectric portion that includes layers fewer than layers of the dielectric multilayer film and that is arranged on a portion excluding the portion over the current injection area on the top surface of the mesa post and on a whole side surface of the mesa post, the dielectric portion being an extension of a part of the layers of the dielectric multilayer film.

6. A method of fabricating a surface emitting laser element that includes a cylindrical mesa post in which a plurality of semiconductor layers including an active layer is grown and that emits a laser light in a direction perpendicular to a substrate surface, the method comprising:
forming a dielectric multilayer film on an area including the mesa post; and
etching the dielectric multilayer film on a side surface of the mesa post while letting a part of layers of the dielectric multilayer film remain so that the remaining dielectric multilayer film covers the whole side surface of the mesa post.

7. The method according to claim 6, wherein the etching includes etching the dielectric multilayer film in at least part of the side surface in a circumferential direction of the side surface.

8. The method according to claim 6, wherein the etching includes etching the dielectric multilayer film in an area that includes the side surface and that surrounds a portion over a current injection area of the active layer.

* * * * *